United States Patent
Nam et al.

(10) Patent No.: US 8,581,364 B2
(45) Date of Patent: Nov. 12, 2013

(54) RESISTANCE MEMORY DEVICES AND METHODS OF FORMING THE SAME

(75) Inventors: KyungTae Nam, Suwon-si (KR); Ingyu Baek, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 343 days.

(21) Appl. No.: 12/963,148

(22) Filed: Dec. 8, 2010

(65) Prior Publication Data

US 2011/0193051 A1  Aug. 11, 2011

(30) Foreign Application Priority Data

Feb. 8, 2010 (KR) .................. 10-2010-0011555

(51) Int. Cl.
*H01L 45/00* (2006.01)
(52) U.S. Cl.
USPC ............ 257/536; 257/E27.047; 257/E45.002; 438/384
(58) Field of Classification Search
CPC .................. H01L 27/1052; H01L 45/147
USPC .................................................. 257/E45.003
See application file for complete search history.

(56) References Cited

U.S. PATENT DOCUMENTS

| | | | |
|---|---|---|---|
| 7,208,372 B2 | 4/2007 | Hsu et al. | |
| 8,116,116 B2 * | 2/2012 | Hwang et al. | ........... 365/148 |
| 2006/0006471 A1 | 1/2006 | Rossel et al. | |
| 2006/0160304 A1 | 7/2006 | Hsu et al. | |
| 2007/0090444 A1 | 4/2007 | Park et al. | |
| 2007/0167008 A1 | 7/2007 | Hsu et al. | |
| 2008/0296551 A1 * | 12/2008 | Nihei et al. | ............ 257/2 |
| 2009/0147558 A1 | 6/2009 | Tamai et al. | |

FOREIGN PATENT DOCUMENTS

| | | |
|---|---|---|
| JP | 2006-203178 | 8/2006 |
| JP | 2007-116166 | 5/2007 |
| JP | 2009-141225 | 6/2009 |
| KR | 10-2007-0043444 | 4/2007 |
| KR | 10-2009-0083094 | 8/2009 |

* cited by examiner

*Primary Examiner* — Stephen W Smoot
(74) *Attorney, Agent, or Firm* — Harness, Dickey & Pierce, P.L.C.

(57) ABSTRACT

Provided are resistance memory devices and methods of forming the same. The resistance memory devices include a first electrode and a second electrode on a substrate, a transition metal oxide layer interposed between the first electrode and the second electrode, an electrolyte layer interposed between the second electrode and the transition metal oxide layer, and conductive bridges having one end that is electrically connected to the second electrode on the electrolyte.

19 Claims, 5 Drawing Sheets

RESISTANCE MEMORY DEVICES AND METHODS OF FORMING THE SAME

CROSS-REFERENCE TO RELATED APPLICATIONS

This U.S. non-provisional patent application claims priority under 35 U.S.C. §119 of Korean Patent Application No. 10-2010-0011555, filed on Feb. 8, 2010, the entire contents of which are hereby incorporated by reference.

BACKGROUND

The present disclosure herein relates to memory devices and methods of forming the same and more specifically to resistance memory devices.

Resistance memory devices apply resistance elements having different resistance values in its memory cells. Known resistance memory devices include, but are not limited to, phase change memory devices (PRAM) having resistance variance according to phase changes, magneto-resistive memory devices (MRAM), and resistance memory devices (RRAM) having a transition metal oxide material.

A resistance memory device using a transition metal oxide material that utilizes the resistance variation of the transition metal oxide layer depending on applied voltage may be implemented as a non-volatile device.

SUMMARY

Embodiments of the present inventive concept provide resistance memory devices having improved reliability, and methods for forming them. Embodiments of the present inventive concept also provide methods of forming resistance memory devices with improved process efficiency.

A resistance memory device according to an embodiment of the present inventive concept may include a first electrode and a second electrode on a semiconductor substrate, a transition metal oxide layer between the first electrode and the second electrode, an electrolyte between the second electrode and the transition metal oxide layer; and a conductive bridge having one end that is electrically connected to the second electrode in the electrolyte layer.

In some embodiments the electrolyte layer may include an amorphous dielectric material, such as an amorphous silicon oxide and/or an amorphous silicon nitride, or a chalcogenide compound.

In other embodiments of the present inventive concept, when a selected voltage is applied to the first electrode and the second electrode, a filament may be formed in the transition metal oxide layer and may electrically connect the conductive bridge, where the conductive bridge may include another end, which contacts the transition metal oxide layer, or the conductive bridge may extend into the transition metal oxide layer.

In still further embodiments the second electrode may include a material that has a higher oxidation power than the first electrode. For example, the second electrode may comprise a conductive oxide material of a rare earth metal.

In an illustrative method of forming a resistance memory device according to an embodiment of the present inventive concept, a first electrode may be formed on a substrate, then a transition metal oxide layer on the first electrode, an electrolyte layer on the transition metal oxide layer, and a metal layer may be foamed on the electrolyte layer. A conductive bridge may be formed by moving metal elements in the metal layer into the electrolyte layer, and forming a second electrode that electrically connects the conductive bridge on the electrolyte layer.

In some embodiments of the present inventive concept, the metal layer may be removed after moving the metal elements. As a result, an upper surface of the electrolyte may be exposed.

In other embodiments of the present inventive concept, the method of moving metal elements may further include irradiating the metal layer with ultraviolet rays, or heat-treating the metal layer and the electrolyte layer, or moving the metal elements in the metal layer into the electrolyte layer in an ion state and reducing the moved metal elements of an ion state within the electrolyte layer. In yet other embodiments of the present inventive concept, the metal elements may move further into the upper portion of the transition metal oxide layer.

In further embodiments of the present inventive concept, the first electrode may include at least one material selected from the group consisting of tungsten, titanium nitride, and tantalum nitride and the second electrode may comprise at least one selected from the group consisting of iridium oxide and ruthenium oxide.

Another method of forming a resistance memory device according to an embodiment of the present inventive concept may include forming a second electrode on a substrate, forming an electrolyte layer on the second electrode, forming a metal layer on the electrolyte layer, forming a conductive bridge by moving metal elements in the metal layer into the electrolyte layer, forming a transition metal oxide layer on the electrolyte layer, and forming a first electrode on the transition metal oxide layer.

BRIEF DESCRIPTION OF THE DRAWINGS

The accompanying drawings are included to provide a further understanding of the present inventive concept, and are incorporated in and constitute a part of this specification. The drawings illustrate exemplary embodiments of the present inventive concept and, together with the description, serve to explain principles of the present inventive concept. In the figures.

DETAILED DESCRIPTION OF THE EMBODIMENTS

Figure 1A:
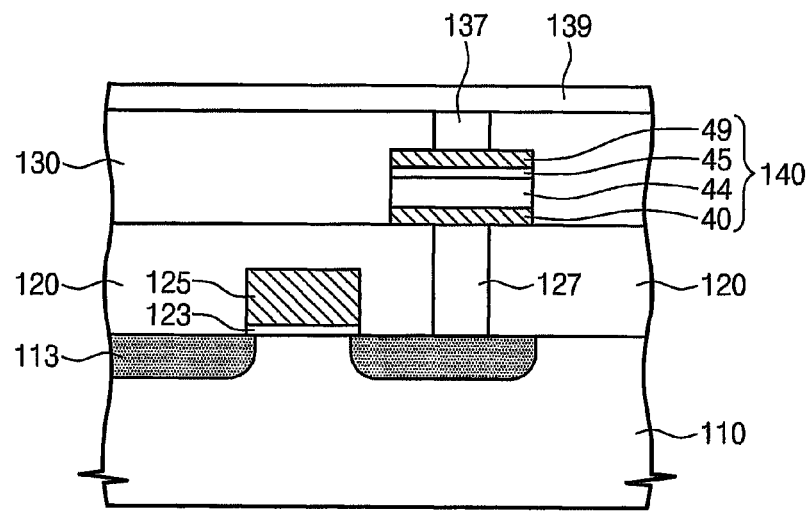
FIGS. 1A through 1B are cross-sectional views of a resistance memory device according to one embodiment of the present inventive concept.

Hereinafter, resistance memory devices and methods of forming the same according to the embodiments of the present inventive concept will be explained. The embodiments of the present inventive concept are provided so that this disclosure will be thorough and complete, and will fully convey the scope of the inventive concept to those skilled in the art and should not be construed as limited to the embodiments set forth herein. The embodiments can have various modifications within the scope and technical concept of the present invention. In this specification, "and/or" is used to mean at least one element between the preceding and following elements. In this specification, it will be understood that when an element is referred to as being "on" another element, it can be directly on the other element or an intervening third element may also be present. It will be understood that, although the terms first, second, third etc. may be used herein to describe elements or portions, these terms are only used for clear and accurate explanation and embodiments should not be limited by these terms. In the drawings, the thicknesses and relative thicknesses of elements are exaggerated for illustration of the technical concept.

Figure 1B:
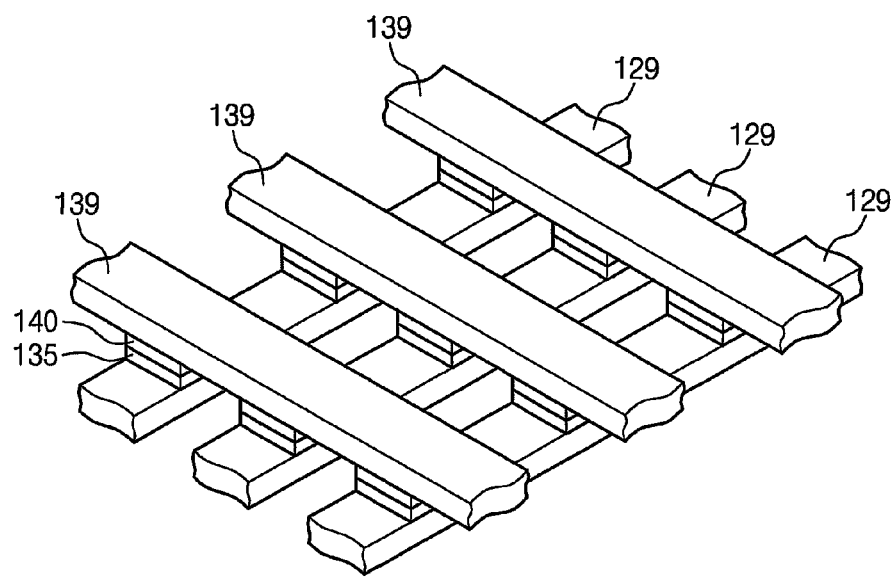
Figure 2:
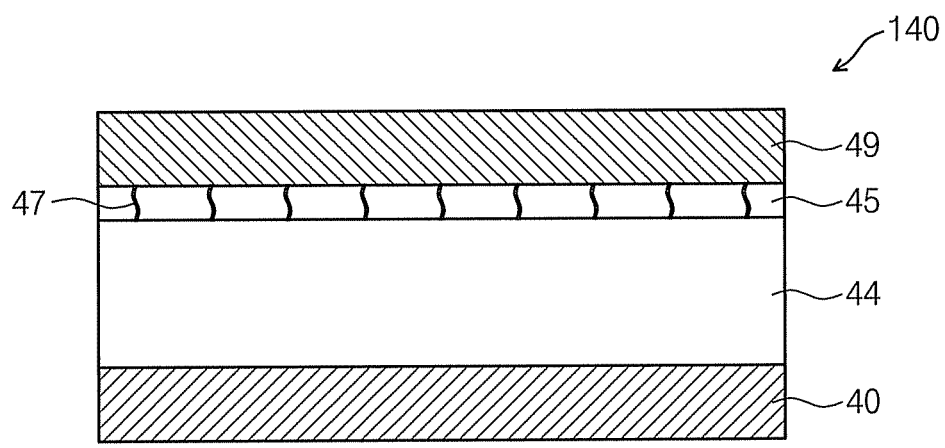
FIG. 2 is a cross-sectional view illustrating a resistance element of a resistance memory device according to some embodiments of the present inventive concept.

Referring to FIGS. 1A through 2, a resistance memory device according to one embodiment of the present inventive concept will be explained. FIG. 1A is a drawing illustrating a cell constituting a resistance memory device according to one embodiment of the present inventive concept and FIG. 2 is an enlarged view of a resistance element 140 of the cell.

A transistor is disposed on a semiconductor substrate 110. The transistor may comprise sequentially stacked gate insulating layer 123 and gate electrode 125 on the semiconductor substrate 110, and a source/drain region 113 in the semiconductor substrate 110 at both sides of the gate electrode 125. Alternatively, the transistor of FIG. 1A may be replaced by other selection devices, such as a diode.

Referring to FIG. 1B, two wirings 139, 129 above and below the resistance element 140 may be disposed crossing each other with the resistance element 140 as a crossing point. One of the two wirings, for example the lower wiring 129, may be connected to the resistance element 140 by a selection device 135. The selection device 135 may be selected among various devices including a diode, carbon nano structure, and capacitor.

A first interlayer dielectric 120 covering the gate electrode 125 and the source/drain region 113 may be disposed on the semiconductor substrate 110. A first contact 127 penetrating the first interlayer dielectric 120 may be disposed on the source/drain region 113. The first contact 127 may be electrically connected to the source/drain region 113. Between the first contact 127 and the source/drain region 113, a silicide layer may additionally be interposed The resistance element 140 may be disposed on the first interlayer dielectric 120, and may comprise a first electrode 40 electrically connected to the first contact 127, a transition metal oxide layer 44 on the first electrode 40, an electrolyte layer 45 on the transition metal oxide layer 44, and a second electrode on the electrolyte layer 45.

The first electrode 40 may comprise at least one selected from the group consisting of metal including iridium (Ir), platinum (Pt), Ruthenium (Ru) and tungsten (W), conductive metal compound including titanium nitride (TiN) and tantalum nitride (TaN), and doped semiconductor. In one embodiment, the first electrode 40 may comprise at least one selected from the group consisting of tungsten, titanium nitride and tantalum nitride.

The transition metal oxide layer 44 may comprise at least one oxide material selected from the group consisting of nickel (Ni), titanium (Ti), vanadium (V), iron (Fe), chromium (Cr), cobalt (Co), hafnium (Hf) and tantalum (Ta). The transition metal oxide layer 44 may have a thickness of ten to two hundred Å.

The electrolyte layer 45 may comprise an insulating solid electrolyte such as at least one material selected from the group consisting of an oxide material such as silicon oxide ($SiO_2$), a nitride material such as silicon nitride (SiN), and a chalcogenide compound. The electrolyte layer 45 may be in an amorphous state.

In this specification, the solid electrolyte may be defined as a material that provides electrons to ions provided from outside, or that receives electrons from ions provided from outside. In one embodiment, such a feature of the solid electrolyte may be caused by the existence of defects within the sold electrolyte. The defects may include electronic defects and/or physical defects. For example, vacancies may exist in the solid electrolyte and the ions provided from outside of the solid electrolyte may be oxidized or reduced by the vacancies. The electrolyte layer 45 may have a thickness of two through fifty Å.

A conductive bridge 47 may be disposed in the electrolyte layer 45, and may be electrically connected to the second electrode 49. The conductive bridge 47 may directly contact the second electrode 49, and may have a diameter of two to fifty nanometers. The conductive bridge 47 may comprise a metal atom having high mobility, for example at least one material selected from the group consisting of copper (Cu), silver (Ag), ruthenium (Ru), titanium (Ti) and iridium (Ir). The conductive bridge 47 may be two to fifty Å long in a vertical direction towards the semiconductor substrate 110.

As explained above, when the electrolyte layer 45 comprises a solid electrolyte, metal elements in the conductive bridge 47 can move with a high mobility in the electrolyte layer 45. Conversely, mobility of the metal elements within the transition metal oxide layer 44 may be reduced. Accordingly, the conductive bridge 47 may not substantially extend out of the electrolyte layer 45.

Figure 3:
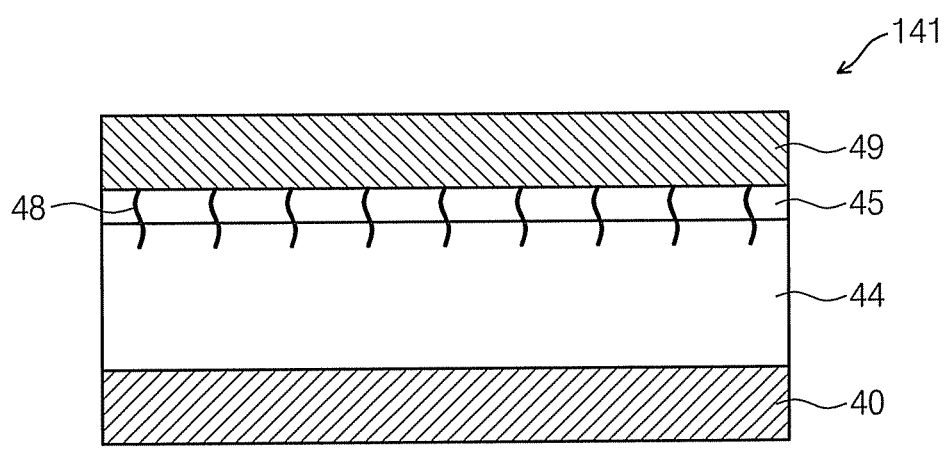
FIG. 3 is a cross-sectional view illustrating a resistance element of a resistance memory device according to another embodiment of the present inventive concept.

Referring to FIG. 3, a conductive bridge 48 may extend into the transition metal oxide layer 44. Unlike the previous discussion, the conductive bridge 48 may extend from an upper surface of the electrolyte 45 into an upper portion of the transition metal oxide layer 44. Since the mobility of metal elements in the conductive bridge 48 in the electrolyte layer 45 may be lower than that in the transition metal oxide layer 44, the conductive bridge 48 may not extend to the lower surface of the transition metal oxide layer 44. In other words, the conductive bridge 48 may be insulated from the first electrode 40.

The second electrode 49 may comprise at least one material selected from the group consisting of iridium (Ir), platinum (Pt), Ruthenium (Ru) and tungsten (W), and other metallic materials, conductive metal oxides, conductive metal nitrides such as titanium nitride (TiN) and tantalum nitride (TaN), and doped semiconductor materials. In an embodiment, the second electrode 49 may comprise a conductive material that has a higher oxidation power than the first electrode 40. In other words, the second electrode 49 may oxidize other materials. The second electrode 49 may comprise a rare earth metal oxide, for example, an iridium oxide (IrO) and/or ruthenium oxide (RuO). Accordingly, during a reset operation of a resistance memory cell, the second electrode 49 can easily oxidize a portion of a filament, which will be explained below, in the transition metal oxide layer 44. In other words, a portion of the filament can easily be removed.

A second interlayer dielectric 130 covering the resistance element 140 may be disposed on the first interlayer dielectric 120. A second contact 137 penetrating the second interlayer dielectric 130 may be disposed on the resistance element 140, and may be electrically connected to the second electrode 49, and may be electrically connected to the wiring 139 on the second interlayer dielectric 130. Unlike the disclosed illustrations, the second contact 137 and the wiring 139 may be one single interconnected structure.

When a selected voltage is applied between the first electrode 40 and the second electrode 49, a filament may be formed in the transition metal oxide layer 44 interposed between the first electrode 40 and the second electrode 49. The resistance element 140 including the transition metal oxide layer 44 in which the filament is formed may have relatively low resistance value. Conversely, when the filament is removed, the resistance element 140 may have a relatively high resistance value. In this specification, the expression that the filament is removed means that a portion of the filament, or the whole filament, which electrically connects the first electrode 40 and the second electrode 49 in the transition metal oxide layer 44, becomes an insulator.

In a resistance memory device according to embodiments of the present inventive concept, when a selected voltage is applied, a filament in the transition metal oxide layer 44 may be generated and then removed at the same position. More specifically, when the voltage is applied between the first electrode 40 and the second electrode 49, the formation of the filament may be induced by the conductive bridge 47 in the transition metal oxide layer 44 and the second electrode 49. Further, the second electrode 49 and the transition metal oxide layer 44 may be selectively connected to each other at locations where the conductive bridge 47 is disposed. Accordingly, the filament can be repeatedly generated and removed at the locations where the conductive bridge 47 is formed. As a result, a resistance distribution during write and/or erase operation of the resistance element can be reduced, thereby improving a reliability of a resistance memory device including the resistance element.

Figure 4:
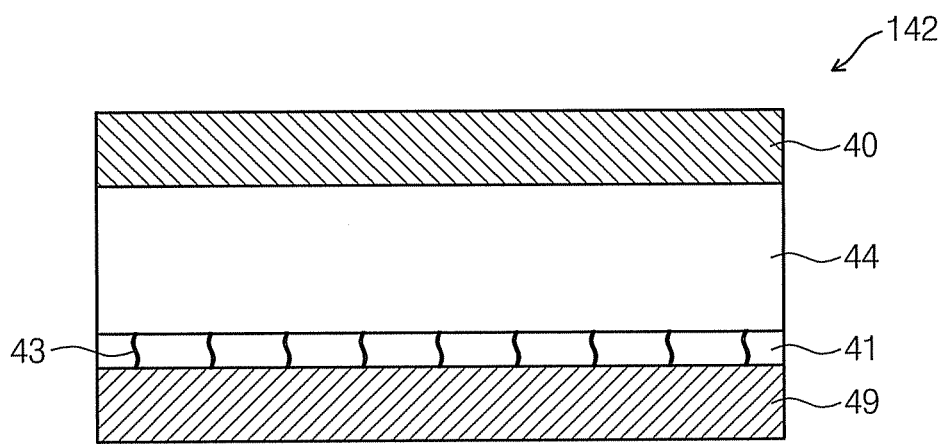
FIG. 4 is a cross-sectional view illustrating a resistance element of a resistance memory device according to still another embodiment of the present inventive concept.

The constituting elements of the resistance element may be disposed in different shapes and positions. Referring to FIG. 4, on a first interlayer dielectric 120 being adjacent to a semiconductor substrate 110, a second electrode 49, an electrolyte layer 41, a transition metal oxide layer 44 and a first electrode 40 may be sequentially stacked to form a resistance element 142.

The electrolyte layer 41 and a conductive bridge 43 in the resistance element 142 may be disposed to be adjacent to the second electrode 49, which may comprise a conductive material having a higher oxidation power than the first electrode 40, for example, a rare earth metal oxide.

Referring to FIGS. 1A, 5A through 5C and 2, a method of forming a resistance memory device according to one embodiment of the present inventive concept will be explained. The explanation of the aforementioned elements may be omitted.

Referring to FIG. 1A, a gate insulating layer 123 and gate electrode 125 may be sequentially formed on a semiconductor substrate 110. The gate insulating layer 123 may be formed by a thermal oxidation process or a deposition process. By performing an ion implantation process using the gate electrode 125 as a mask, a source/drain region 113 may be formed in the semiconductor substrate 110 at both sides of the gate electrode 125. A first interlayer dielectric 120 covering the gate electrode 125 and the source/drain region 113 may be formed. Subsequently, a hole penetrating the first interlayer dielectric 120 may expose at least a portion of the source/drain region 113. Filling the hole with a conductive material may form a first contact 127 penetrating the first interlayer 120.

Figure 5A:
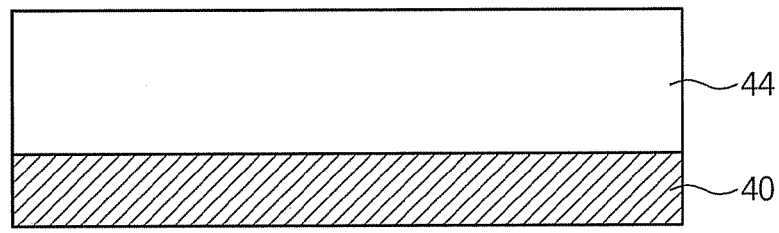
FIGS. 5A through 5C are cross-sectional views to illustrate a method of forming a resistance memory device according to one embodiment of the present inventive concept.

Referring to FIG. 5A, a first electrode 40 may be formed on the first interlayer dielectric 120, and it may be formed on the first contact 127. The first electrode 40 may comprise at least one material selected from the group consisting of iridium (Ir), platinum (Pt), Ruthenium (Ru) and tungsten (W), conductive metal compounds including titanium nitride (TiN) and tantalum nitride (TaN), and doped semiconductors. For example, the first electrode 40 may comprised at least one material selected from the group consisting of tungsten, titanium nitride and tantalum nitride.

A transition metal oxide layer 44 may be formed on the first electrode 40, and may comprise at least one oxide material selected from the group consisting of nickel (Ni), titanium (Ti), vanadium (V), iron (Fe), chromium (Cr), cobalt (Co), hafnium (Hf) and tantalum (Ta). The transition metal oxide layer 44 may have a thickness of ten to five hundred Å.

Figure 5B:
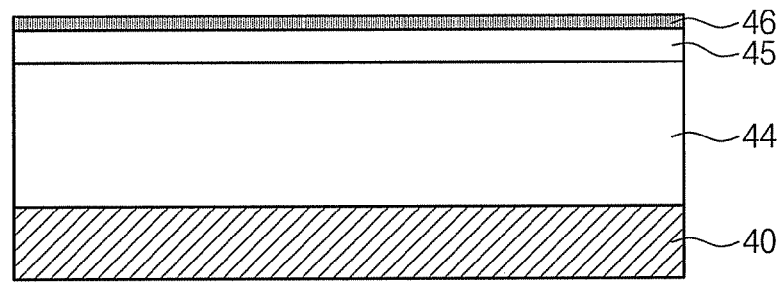

Referring to FIG. 5B, an electrolyte layer 45 may be formed on the transition metal oxide layer 44, and may comprise an insulating solid electrolyte, for example at least one material selected from the group consisting of silicon oxide ($SiO_2$), silicon nitride (SiN), and chalcogenide compound. The electrolyte layer 45 may have a thickness of two to fifty Å.

A metal layer 46 may be formed on the electrolyte layer 45. The metal layer 46 may comprise a metal having a high mobility, for example, at least one material selected from the group consisting of copper (Cu), silver (Ag), ruthenium (Ru), titanium (Ti) and iridium (Ir). During forming the metal layer 46, some metal elements may move into the electrolyte layer 45. This movement may be caused by the process heat of the metal layer forming process and the high mobility of the metal elements. To facilitate the movement of the metal elements into the electrolyte layer 45, the metal layer 46 may be irradiated with a ultra-violet wavelength. The metal may alternatively be heated to move the elements into the electrolyte layer 45, upon which the metal layer 46 is formed. The irradiation and heating may be performed together or may be carried out separately or sequentially.

Figure 5C:
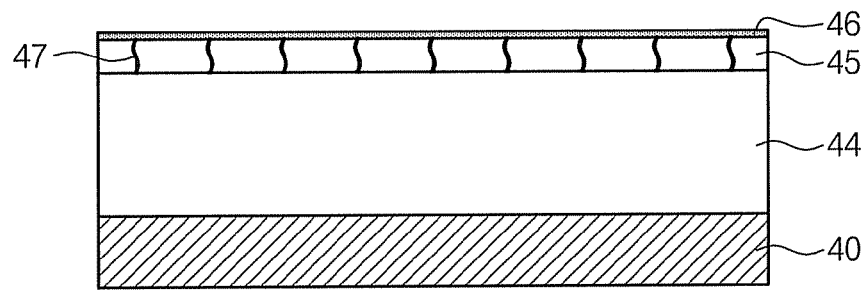
Figure 6A:
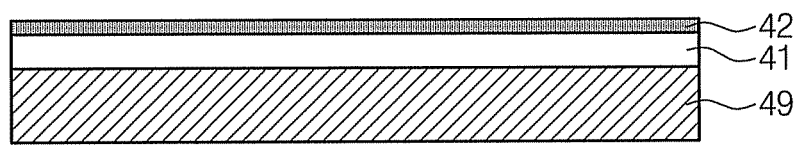
FIGS. 6A through 6B are cross-sectional views to illustrate a method of forming a resistance memory device according to another embodiment of the present inventive concept.
Figure 6B:
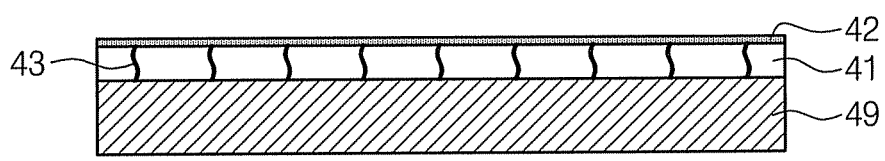

Referring to FIG. 5C, according to the formation of the metal layer 46 and/or the additional process (irradiation and/or hear supply), the metal elements in the metal layer 46 may move into the electrolyte layer 45 in an ion state. Because the electrolyte layer 45 may include a solid electrolyte, the metal ions provided from the metal layer 46 to the electrolyte layer 45 may be reduced, as receiving electrons from the electrolyte layer 45. As a result, a conductive bridge 47, which is an arrangement of metal atoms from the metal layer 46, may be formed in the electrolyte layer 45.

One end of the conductive bridge 47 may contact the transition metal oxide layer 44. Conversely, the metal elements forming the conductive bridge 47 may move further, thereby extending the conductive bridge 47 into the upper portion of the transition metal oxide layer 44.

Referring back to FIG. 1A, the metal layer 46 may be removed by an etching process and/or chemical mechanical polishing process. Accordingly, the upper surface of the electrolyte layer 45 may be exposed. Conversely, removing the metal layer may be omitted. The metal layer may be formed to have a thickness of about several Å, and by applying a selected voltage after the formation of the resistance element, the metal elements in the metal layer 46 may be moved into the electrolyte layer 45.

A second electrode 49 may be formed on the electrolyte layer 45, and may comprise a conductive material having a higher oxidation power than the first electrode. For example, the second electrode 49 may provide oxygen to an upper portion of the transition metal oxide layer 44. In one embodiment, the second electrode 49 may comprise a rare earth metal oxide material.

A second interlayer dielectric 130 may be formed to cover the second electrode 49. Thereafter, a second contact 137, which penetrates the second interlayer dielectric 130 and is connected to the second electrode 49, may be formed. The second contact may be formed simultaneously with a wiring 139 on the second interlayer dielectric 130. In contrast, the wiring 139 may be formed by forming a separate conductive layer from the second contact on the second interlayer dielectric 130 and then patterning the conductive layer.

Referring to FIGS. 1A, 6A, 6B and 4, a method of forming a resistance memory device according to another embodiment of the present inventive concept will be explained. The resistance element 140 of FIG. 1A can be substituted with a resistance element 142 of FIG. 4 and the explanation of the aforementioned elements may be omitted.

Referring to FIG. 1A, a second electrode 49 may be formed on a first interlayer dielectric 120. The second electrode 49 may comprise a conductive material that has a higher oxidation power than a first electrode 40, which will be explained below. For example, the second electrode 49 may provide oxygen to a lower portion of a transition metal oxide layer 44 which will be explained below. In one embodiment, the second electrode 49 may comprise a rare earth oxide material.

An electrolyte layer 41 may be formed on the second electrode 49. The electrolyte layer 41 may comprise a solid electrolyte, and may comprise a dielectric material containing defects, and may comprise a dielectric material in an amorphous state.

A metal layer 42 may be formed on the electrolyte layer 41. The metal layer 42 may comprise a metal having a high mobility, and may comprise at least one material selected from the group consisting of copper (Cu), silver (Ag), ruthenium (Ru), titanium (Ti) and iridium (Ir). During formation of the metal layer 42, some metal elements may move into the electrolyte 41. This movement may be caused by the process heat of the metal layer forming process and the high mobility of the metal elements. Alternatively, the metal layer may be irradiated with ultra-violet radiation, or thermal process may move the metal elements into the electrolyte layer 41, upon which the metal layer 42 is formed. The irradiation and heat supply can be performed altogether or may be carried out separately.

Referring back to FIGS. 1A and 4, the metal layer 42 may be removed. The removed metal layer 42 may be a metal layer 42 that remains on the electrolyte layer 41 after some metal elements move into the electrolyte layer 41. The metal layer 42 may be removed by a chemical mechanical polishing process, thus exposing the upper surface of the electrolyte layer 41.

A transition metal oxide layer 44 may be formed on the exposed electrolyte layer 41. Thereafter, a first electrode 40 may be formed on the transition metal oxide layer 44. In one embodiment, the first electrode 40 may comprise at least one material selected from the group consisting of iridium (Ir), platinum (Pt), Ruthenium (Ru) and tungsten (W), conductive metal compounds including titanium nitride (TiN) and tantalum nitride (TaN), and doped semiconductors. The first electrode 40 may comprise at least one material selected from the group consisting of tungsten, titanium nitride and tantalum nitride.

According to the embodiments of the present inventive concept, resistance memory devices, which may include an electrolyte layer that includes a conductive bridge between an electrode and a transition metal oxide layer, may be provided. During the operation of such resistance memory devices, the distribution of filaments in the transition metal oxide layer can be reduced due to the conductive bridge in the transition metal oxide layer. As a result, resistance distribution of a resistance memory device can be reduced, thereby improving the reliability of the resistance memory device.

What is claimed is:

1. A resistance memory device, comprising:
   a first electrode and a second electrode on a semiconductor substrate;
   a transition metal oxide layer interposed between the first electrode and the second electrode;
   an electrolyte layer interposed between the second electrode and the transition metal oxide layer; and
   a conductive bridge disposed in the electrolyte layer having one end electrically connected to the second electrode,
   wherein the conductive bridge includes a metal atom selected from the group consisting of copper (Cu), silver (Ag), ruthenium (Ru), titanium (Ti) and iridium (Ir).

2. The resistance memory device of claim 1, wherein the electrolyte layer comprises at least one of a dielectric material and a chalcogenide compound.

3. The resistance memory device of claim 2, wherein the electrolyte layer comprises at least one of an amorphous silicon oxide and an amorphous silicon nitride.

4. The resistance memory device of claim 1, wherein the transition metal oxide layer comprises at least one material selected from the group consisting of nickel (Ni), titanium (Ti), vanadium (V), iron (Fe), chromium (Cr), cobalt (Co), hafnium (Hf) and tantalum (Ta).

5. The resistance memory device of claim 1, further including a filament disposed in the transition metal oxide layer and electrically connected to the conductive bridge when a selected voltage is applied to the first electrode and the second electrode.

6. The resistance memory device of claim 1, wherein the conductive bridge at least one of contacts a surface of the transition metal oxide layer and extends into the transition metal oxide layer.

7. The resistance memory device of claim 1, wherein the second electrode comprises a material that has a higher oxidation power than the first electrode.

8. The resistance memory device of claim 7, wherein the second electrode comprises a conductive oxide of a rare earth metal.

9. The resistance memory of claim 8, wherein the second electrode comprises at least one of iridium oxide (IrO) and ruthenium oxide (RuO), and The first electrode comprises at least one of iridium (Ir), platinum (Pt), Ruthenium (Ru) and tungsten (W), titanium nitride (TiN), tantalum nitride (TaN), and doped semiconductors.

10. A method of forming a resistance memory device, comprising:
   forming a first electrode on a substrate;
   forming a transition metal oxide layer on the first electrode;
   forming an electrolyte layer on the transition metal oxide layer;
   forming a metal layer on the electrolyte layer;
   forming a conductive bridge by moving metal elements in the metal layer into the electrolyte layer; and
   forming a second electrode that electrically connects the conductive bridge on the electrolyte layer,
   wherein the conductive bridge includes a metal atom selected from the group consisting of copper (Cu), silver (Ag), ruthenium (Ru), titanium (Ti) and iridium (Ir).

11. The method of claim 10, further comprising moving metal elements, and removing the metal layer to expose the upper surface of the electrolyte layer.

12. The method of claim 10, wherein moving metal elements further comprises irradiating the metal layer with ultraviolet radiation.

13. The method of claim 10, wherein moving metal elements further comprises heat-treating the metal layer and the electrolyte layer.

14. The method of claim 10, wherein forming a conductive bridge comprises moving the metal elements in the metal layer into the electrolyte layer in an ion state and reducing the moved metal elements of an ion state within the electrolyte layer.

15. The method of claim 10, further comprising moving the metal elements into an upper portion of the transition metal oxide layer.

16. The method of claim 10, wherein the first electrode comprises at least one selected from the group consisting of tungsten, titanium nitride, and tantalum nitride and the second electrode comprises at least one selected from the group consisting of iridium oxide and ruthenium oxide.

17. A method of forming a resistance memory device, comprising:

forming a second electrode on a substrate;
forming an electrolyte layer on the second electrode;
forming a metal layer on the electrolyte layer;
forming a conductive bridge by moving metal elements in the metal layer into the electrolyte layer;
forming a transition metal oxide layer on the electrolyte layer; and
forming a first electrode on the transition metal oxide layer,
wherein the conductive bridge includes a metal atom selected from the group consisting of copper (Cu), silver (Ag), ruthenium (Ru), titanium (Ti) and iridium (Ir).

18. The method of claim 17, wherein forming a conductive bridge comprises moving the metal elements in the metal layer into the electrolyte layer in an ion state and at least one of irradiating the metal layer with ultraviolet radiation, heat-treating the metal layer and the electrolyte layer.

19. The method of claim 18, wherein the irradiating with ultraviolet and the heat-treating are performed at least one of simultaneously, sequentially, and separately.

\* \* \* \* \*